United States Patent
Kasuya

[19]

[11] Patent Number: 6,077,304
[45] Date of Patent: *Jun. 20, 2000

[54] VERIFICATION SYSTEM FOR SIMULATOR

[75] Inventor: Atsushi Kasuya, Sunnyvale, Calif.

[73] Assignee: Sun Microsystems, Inc., Palo Alto, Calif.

[*] Notice: This patent is subject to a terminal disclaimer.

[21] Appl. No.: 09/152,956

[22] Filed: Sep. 14, 1998

Related U.S. Application Data

[63] Continuation of application No. 08/632,086, Apr. 15, 1996, Pat. No. 5,905,883.

[51] Int. Cl.[7] .............................. G06F 11/00; G06F 9/44
[52] U.S. Cl. ..................... 703/14; 709/300; 395/500.06
[58] Field of Search ......................... 395/500.35, 500.38, 395/680, 183.07, 183.13, 500.06; 703/14; 709/300

[56] References Cited

U.S. PATENT DOCUMENTS

| | | | |
|---|---|---|---|
| 5,163,016 | 11/1992 | Har'El et al. | 364/578 |
| 5,812,416 | 9/1998 | Gupte et al. | 364/490 |
| 5,841,967 | 11/1998 | Sample et al. | 395/183.09 |
| 5,905,883 | 5/1999 | Kasuya | 395/500 |

*Primary Examiner*—Kevin J. Teska
*Assistant Examiner*—Thai Phan
*Attorney, Agent, or Firm*—Steven F. Caserza; Flehr Hohbach Test Albritton & Herbert

[57] ABSTRACT

An electronic circuit verification system and method includes an HDL circuit simulator and a circuit simulation verifier that pass control back and forth between each other, and that cooperate so as to perform circuit verification tasks than would be very difficult to perform using only the HDL circuit simulator. The circuit simulation verifier executes a test bench so as to define operational correctness and/or performance criteria, including at least one Expect Event, each Expect Event comprising a combination of one or more signal values that are expected to occur during simulation, and a time frame during which the signal value combination is expected to occur. The circuit simulation verifier includes instructions for blocking execution of a thread of execution associated with the test bench until the earlier of the combination of one or more signal values occurring during simulation and the time frame expiring.

37 Claims, 5 Drawing Sheets

VERIFICATION SYSTEM FOR SIMULATOR

RELATED APPLICATIONS

This application is a continuation application of U.S. patent application Ser. No. 08/632,086; filed Apr. 15, 1996, now U.S. Pat. No. 5,905,883 issued May 18, 1999.

This invention relates to circuit design verification systems and in particular to a method and apparatus for verifying that the design of complex electronic circuits meet user specified operational correctness and performance criteria.

A portion of the disclosure of this patent document contains materials to which a claim of copyright protection is made. The copyright owner has no objection to the facsimile reproduction by anyone of the patent document or the patent disclosure, but reserves all other rights whatsoever.

BACKGROUND OF THE INVENTION

The term "circuit simulator" is used in this document to mean any of the family of design tools used to simulate the operation of electronic circuits, including analog circuit simulators, logic simulators, and HDL simulators.

The term "waveform" is used in this document to mean a sequence of values associated with a signal over a period of time, or equivalently, a sequence of one or more changes in the value of a signal over a period of time.

The detailed circuit specification used by circuit simulators and other circuit design tools is often called a netlist, and comprises a list of circuit components and the interconnections between those components. Circuit components are also known as "cells" where each cell in a specific circuit library has both a logical representation, as well as a circuit layout representation.

The netlist defines all of the interconnections between the components of the circuit. Each "signal" which interconnects two or more cells, or which represents an input or output for the entire circuit, is actually a node in the circuit which has been assigned a name. The terms "net," "signal" and "node" are often used interchangeably.

In addition, the netlist specifies the nature of its components by specifying a cell name for each component. The cell name, in turn, specifies or points to a particular circuit in a predefined library of cells.

Circuits can also be represented by a list of statements in a Hardware Description Language (HDL), such as Verilog or VHDL. The HDL circuit description is then converted into a specific circuit netlist either by an engineer or by an HDL circuit synthesizer using a specified set of library cells. Complex custom integrated circuits (ICs) are often designed by engineers at the "HDL level" and are specified by those engineers for simulation and verification purposes using an HDL circuit description such as a Verilog language circuit description.

Verifying the correctness of complex custom integrated circuits (ICs) and application specific integrated circuits (ASICs) or complete systems is a difficult and complicated task. In order to create the necessary conditions to detect defects in a circuit design, highly parallel but well-controlled verification programs must be written. In such programs, test patterns must be applied to the circuit's input ports and signals at the output ports must be observed over time to determine whether the inputs were transformed into the expected outputs. A computer based model of the circuit design that is being tested is generally referred to as the device under test (DUT). The testing verifies functional correctness, not manufacturing faults.

In the prior art, the most common method used to accomplish this task is to "surround" the DUT with a layer of code that performs the stimulus generation and output comparisons. This layer of code, often referred to as a test bench, can be very simple or as complex as necessary for the application at hand.

In the prior art, one difficulty in creating complex test benches arises when there are many types of events that are not expected to happen at specific times, but rather "some time" within a certain relationship to other events. For example, in a bus transaction, a designer might send a request and want to have it acknowledged within a certain window of time. However, whether the reply comes within 2 or 20 cycles might be irrelevant. Similarly, an arbiter may assign a given resource in ways that are difficult to predict and may not matter. What will actually matter is that in the end all the requests presented to the arbiter for servicing are satisfied by the arbiter and that the ordering satisfies a specified general policy.

These two examples reflect a common problem in the verification of complex circuits, namely that the inherently parallel nature of complex electronic circuits results in time and ordering ambiguities or uncertainties. A circuit designer seeking to verify such a complex circuits needs to be able to describe what is the expected behavior, without over-specifying exactly what should happen when.

Accordingly, it is the object of the present invention to provide a circuit verification system that is capable of verifying the operational correctness and performance characteristics of complex circuits, while enabling such criteria to be defined without having to precisely define exactly when associated signal combinations must occur. It is also an object of the present invention to provide a circuit verification system that can specify circuit correctness and performance criteria while accommodating signal ordering ambiguities.

SUMMARY OF THE INVENTION

An electronic circuit verification system and method includes circuit simulation procedures, often called a circuit simulator, and circuit simulation verification procedures, sometimes called a circuit simulation verifier, that cooperate so as to perform circuit verification tasks than would be very difficult to perform using only the circuit simulator. The circuit simulation verification procedures control the circuit simulation procedures' operation, including specifying conditions under which the simulation of a specified circuit is to stop and specifying input signal waveforms to be used by the circuit simulation procedures.

The circuit simulation verifier receives signal waveforms generated by the HDL circuit simulator for specified watched signals. The circuit simulation verifier then determines whether predefined logical combinations of the watched signals meet specified operational correctness and/or performance criteria within specified time frames. One type of signal combination and timing requirement is called an "Expect Event." An Expect Event is considered to be active during the Expect Event's associated time frame, during which the circuit simulation verifier waits for signals from the HDL circuit simulator that will indicate whether or not the Expect Event is satisfied.

A test bench is composed of a sequence of instructions, including instructions indicating when to activate various Expect Events, instructions for sending commands to the HDL simulator, and conditional branch instructions for controlling which instructions of the test bench are to be executed. Furthermore, a test bench can include instructions for generating a plurality of distinct concurrent threads of execution, each of which is composed of its own sequence of instructions, and furthermore can include instructions for conditionally spawning additional threads of execution when specified combinations of Expect Events are satisfied.

For instance, a test bench may use N threads to set up and test N Expect Events during either different or overlapping time periods of a circuit simulation. Furthermore, the test bench may specify that when a predefined combination of the N Expect Events are satisfied, that one or more other threads of execution with their own sequences of instructions are to be executed.

Test benches thus have standard program control features, as well as thread control features.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
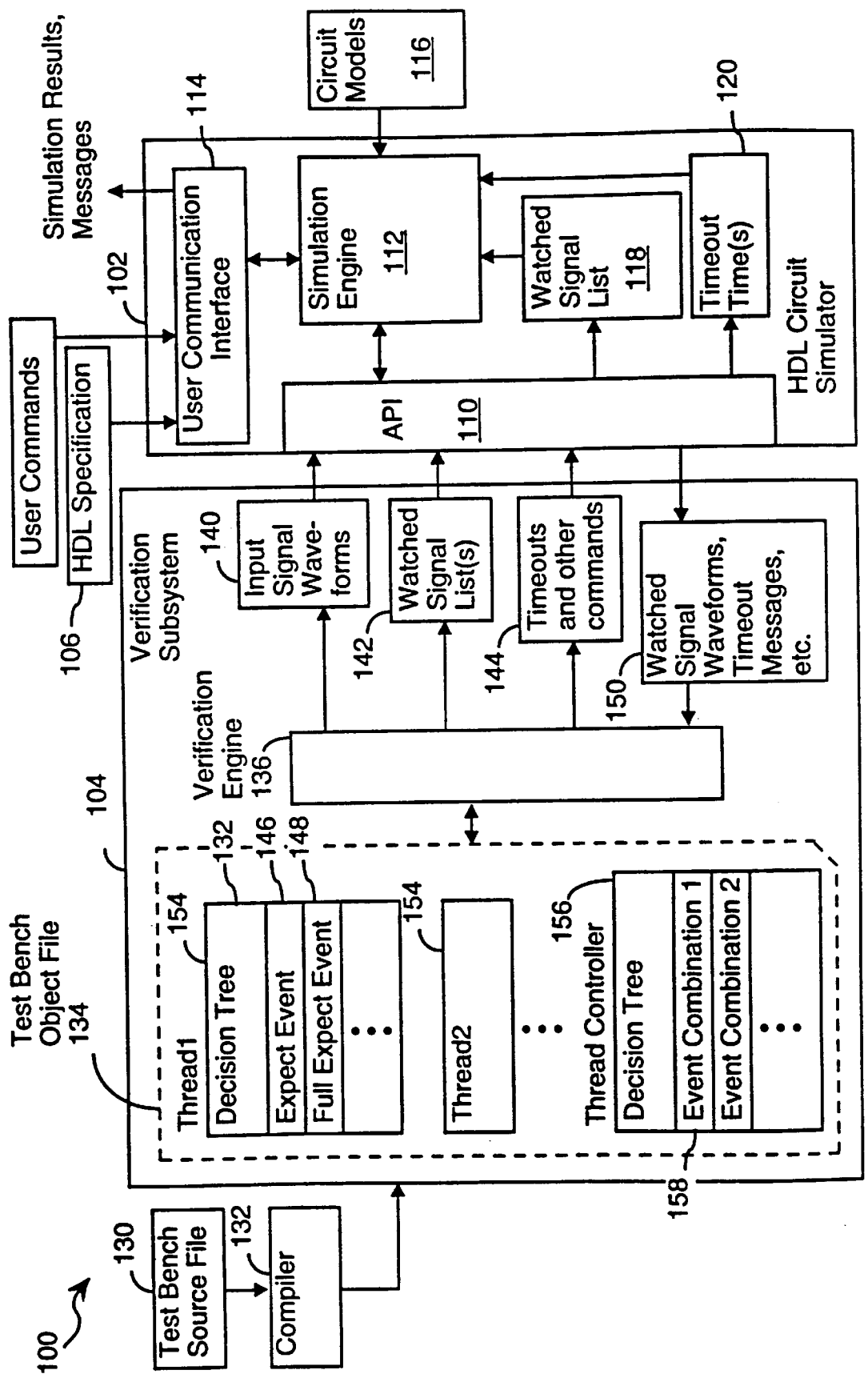
FIG. 1 is a conceptual representation of a circuit simulation verification system according to a preferred embodiment of the present invention.
Figure 2:
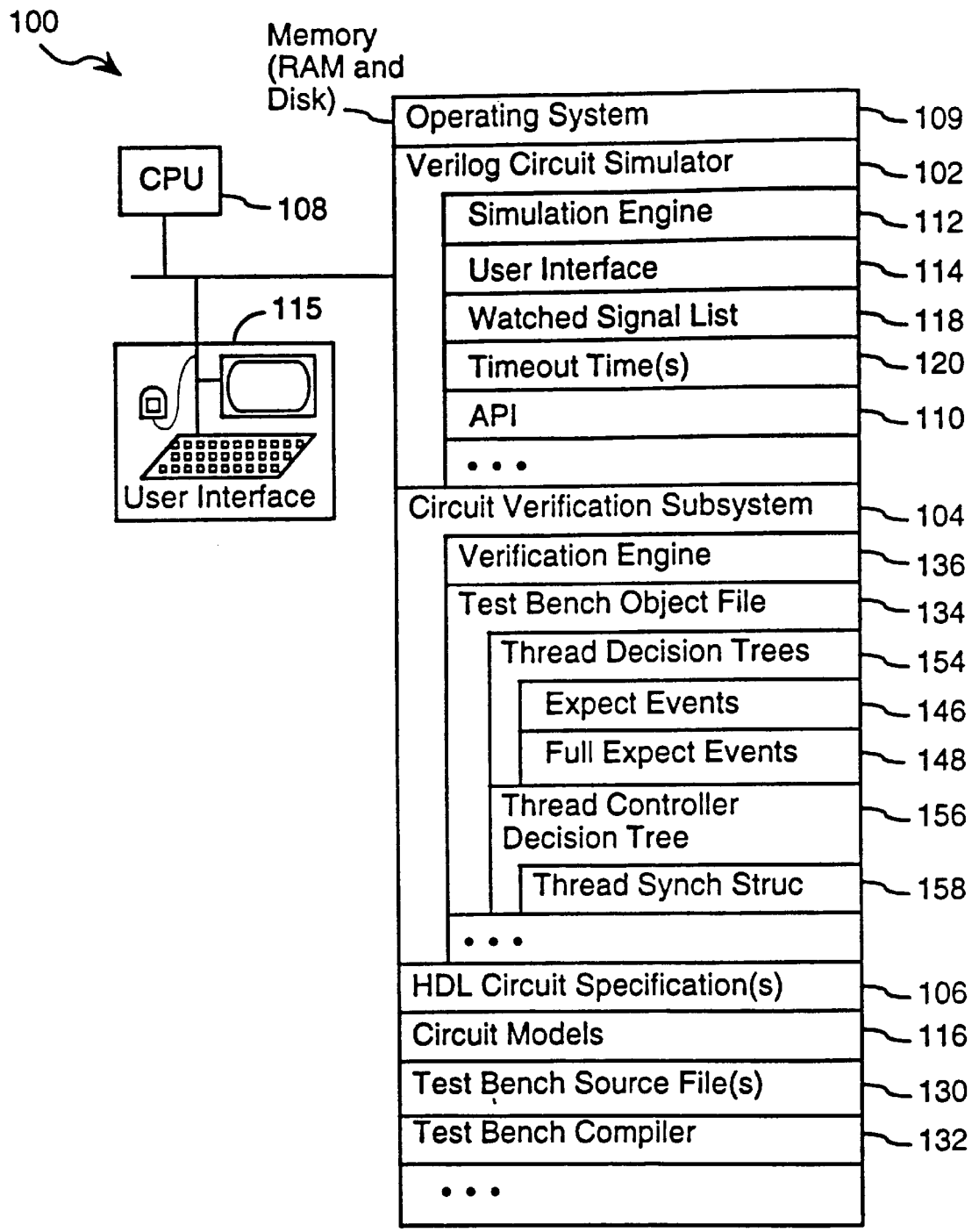
FIG. 2 shows a block diagram of a computer system in which a preferred embodiment of the circuit simulation verification system is implemented.

Referring to FIGS. 1 and 2, there is shown a circuit simulation system 100 in accordance with the present invention. The two primary components of the system are an HDL circuit simulator 102 and a simulation verification subsystem 104. The HDL circuit simulator 104, which in the preferred embodiment is the Verilog HDL circuit simulator, simulates the operation of an electronic circuit specified with an HDL level circuit specification 106. While this HDL circuit simulator 102 is well designed for simulating the operation of the specified circuit and determining the waveforms of signals within the specified circuit, the HDL circuit simulator 102 is not well designed for verifying that the operation of the specified circuit meets various user specified operational correctness and performance criteria. This is especially true when the user specified operational correctness and performance criteria involve extended time ranges during which certain signal combinations must occur or must not occur, and/or involve verifying that certain events all occur and/or occur in a specific order, but where the exact time at which the signal combinations will occur and/or the exact time at which the events will occur is unknown to the circuit designer.

The "specified circuit," as specified by the HDL circuit specification, is sometimes called the "ce under test" or "DUT."

In the preferred embodiment, the HDL circuit simulator 102 and the circuit operation verifier 104 are executed by the same CPU 108, and in fact operate together in most respects as a single program. Suitable operating systems 109 include, for example, UNIX (marketed by many companies under license from AT&T), Solaris (marketed by Sun Microsystems, Inc.) and Windows NT (marketed by Microsoft Corp.).

The HDL circuit simulator 102 includes an application program interface (API) 110 that enables other programs to control the operation of the HDL circuit simulator 102 through the use of pre-established instructions (actually procedure calls).

Since the operation of HDL circuit simulators, and the Verilog HDL circuit simulator in particular, is well documented and well known to those of ordinary skill in the art of electronic circuit simulation, only the few aspects of such simulators most relevant to the present invention are provided in this document. It is noted here that HDL circuit simulators are "boolean logic circuit simulators" in which all signals in the simulated circuit are defined to have logical values, at each point in time, that are equal to one of a small set of predefined values, typically including 0, 1, and Z (a high impedance state in which the signal value is unknown), and possibly a small number of additional "unknown" or "don't care" values.

The HDL circuit simulator 102 includes a simulation engine 112 that simulates the operation of the circuit specified by the HDL circuit specification 106 received from the system's user via a user interface procedure 114 that handles communications with a user via a computer user interface 115 (hereinafter collectively called the user interface 114, 115). The simulation engine 112 simulates the operation of specific circuit components in accordance with predefined circuit models 116, typically stored in a library of such models. The circuit models 116 define not only the functionality of the circuit components but the time domain and frequency domain transfer characteristics of each circuit component when manufactured using a particular circuit manufacturing process. The performance of the specified circuit as simulated by the simulation engine 112 is also determined by the waveforms of the specified circuit's input signals. The input signal waveforms can be specified by the user via the user interface 114, 115, or can be specified through the API 110 through the use of predefined procedure calls for defining input signal waveforms.

Data structures supported by the HDL circuit simulator 102 that are utilized by the circuit verification subsystem 104 include a watched signal list 118 and a set of one or more timeout values 120. The watched signal list 118 consists of a list of signals in the simulated circuit. More specifically, the watched signal list 118 is a list of all circuit signals whose values are relevant to the operational correctness and performance criteria that are currently being monitored by the circuit verification subsystem. The simulation engine 112 stops the simulation of the specified circuit whenever any signal in the watched signal list 118 changes value. When the simulation engine 112 reaches a specified timeout value 120, the simulation stops and control is returned either to the system's user via the user interface 114, 115, or to the verification subsystem 104, depending on what instructions the circuit simulator 102 has been given by the verification subsystem 104.

Each distinct "circuit verification test procedure" is called a "test bench." While a test bench can be simple or complex in structure, the primary functions of a test bench are: to specify input signal waveforms, to specify operational correctness and performance criteria, and to specify operations to be performed when various ones of the operational correctness and performance criteria are satisfied or are breached. Each test bench is initially prepared as a test bench source file 130, which is then processed by a test bench compiler 132 so as to generate an executable test bench object file 134.

The test bench object file is executed in conjunction with a verification engine 136 that controls and coordinates the tasks performed by the circuit verification subsystem 104.

A test bench is a computer program, and thus can perform any operation, sequence of operations, and/or combination or operations, that the circuit verification subsystem 104 is capable of performing. While the set of all possible operations is fairly diverse, the primary operations that can be performed by the circuit verification subsystem are:

specifying input signal waveforms 140 to be used by the circuit simulator;

specifying a set 142 of signals to be watched by the circuit simulator, specifying timeouts 144 for the circuit simulator;

specifying operational correctness and performance criteria 146, 148, including specifying logical combinations of signals that must occur or not occur in specified time periods;

receiving information 150 from the circuit simulator, including signal waveforms for watched signals, timeout messages, and other information concerning the status of the circuit simulation being performed;

sending commands to the circuit simulator for starting and restarting execution of the simulation engine, for controlling the simulation engine's mode of operation, including specifying what actions are to be taken by the circuit simulator when various error conditions are encountered;

using the information received from the circuit simulator 102 to determine whether or not a specified circuit has satisfied the operational correctness and performance criteria specified by the test bench;

generating reports as to whether or not a specified circuit has satisfied the operational correctness and performance criteria specified by the test bench; and thread control operations, including launching additional concurrent threads of execution, terminating threads of execution, synchronizing various threads of execution through the use of "event signals" that cross thread boundaries, and joining various threads of execution.

The test bench object file 134 includes a decision tree 154 for each distinct thread of execution associated with the test bench. The decision tree 154 represents the operations to be performed by a particular thread of execution of the circuit verification subsystem, and conditional branches that govern which of those operations are actually performed during any particular circuit simulation. As shown in FIG. 1, the decision tree 154 for a thread of execution may include data structures called Expect Events 146 and Full Expect Events 148, which will be described in more detail below.

The test bench object file 134 also includes a thread controller decision tree 156. The thread controller decision tree 156 contains instructions and data structures defining when to initiate the execution of the test bench's various threads of execution. In particular, for each event, combination of events, or other synchronization condition that represents the predicate for starting or continuing the execution of a thread, there is a corresponding thread synchronization data structure 158 that defines the conditions under which a thread of execution is to start or continue execution.

Figure 3A:
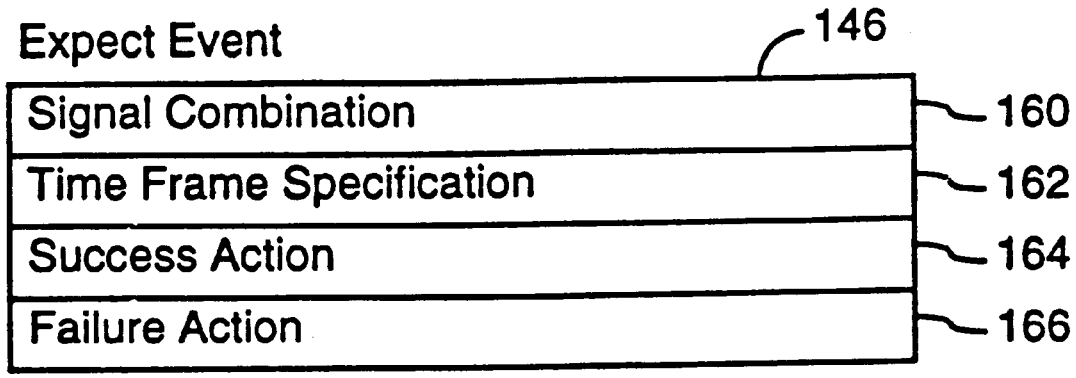
FIGS. 3A, 3B and 3C depict data structures used by a circuit simulation verification system in a preferred embodiment of the present invention.

Referring to FIG. 3A, an Expect Event 146 includes information indicating a combination of one or more signal conditions 160 and a time frame 162 in which that combination of signal conditions is expected to occur. For example, the following signal combination:

SignalA=0& (SignalB=1 or SignalC=1) & SignalDataBus=123 indicates that the Expect Event will be satisfied when SignalA is equal to 0, either SignalB or SignalC is equal to 1, and the value of the signals on a data bus called SignalDataBus is equal to 123.

Each Expect Event 146 also includes a success action 164 and a failure action 166. The success action 164 is typically a branch instruction for enabling execution of subsequent steps in the decision tree for the thread in which the Expect Event is defined. The failure action 166 is typically either (A) the generation of an error message followed by termination of the circuit simulation and return of control to the system's user, or (B) setting an error flag prior to continuing execution of the associated thread. The error flag can then be tested by subsequent steps of thread so as to determine what actions are to be performed by that thread. For instance, when an Expect Event fails, the thread in the circuit verification subsystem 102 that detects the failure may assert additional input signal waveforms designed to help the user determine the state of the circuit being simulated and how the failure occurred.

An example of the source code test bench specification for an Expect Event is as follows:

@5,100 foo_bus.ack_1==1'b0 soft
if (flag ( )) {
    <Failure action instructions>
}
<Success action instructions>

In this example, the "@5,100" part of the first line indicates that the time frame for the Expect Event starts five simulation clock cycles from the current simulation time and ends one hundred simulation clock cycles later. The "foo_bus.ack_1==1'b0" text specifies that the Expect Event "signal combination" is a particular signal being driven to a value of "0". In other words, this Expect Event specifies that a particular signal should be driven to a value of "0" at some point with a particular time frame. That is, the specified signal must be equal to "0" for at least an instant to satisfy the Expect Event and to thereby "unblock" the thread in which the Expect Event was executed. The "soft" part of the first line indicates a flag is to be set at the end of the time frame if the specified signal combination has not occurred. The "if (flag ( ))" is the conditional branch command for determining if the immediately preceding Expect Event failed.

Figure 3B:
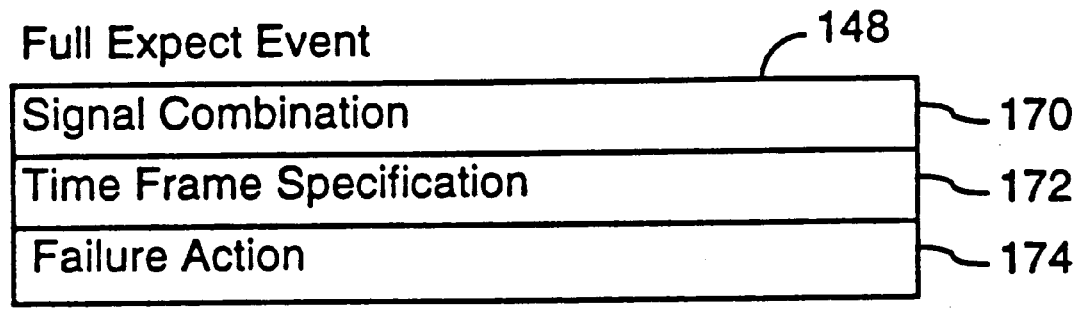

Referring to FIG. 3B, an Full Expect Event 148 includes information indicating a combination of one or more signal conditions 170 and a time frame 172, where the specified combination of signal conditions is expected to remain true continuously for the entire specified time frame. If the specified signal combination is not satisfied at any time during the specified time frame, then the failure action 174 specified by the Full Expect Event 148 is performed. Thus, Full Expect Events are used to specify conditions, or combinations of conditions that are indicative of proper performance of the specified circuit. For instance, the signal combination 170 may be of the form:

(Signal Combination 1) AND (Signal Combination 2) AND . . . . .

where each of the signal combinations represents a required condition or state for a respective portion the specified circuit throughout the specified time period. If the specified circuit is ever in a condition other than its specified legal state during the specified time period, the Full Expect Event 148 fails and its failure action 174 is performed.

The watched signal list 118, 142 (see FIG. 1.) generated by the test bench and used by the circuit simulator 102 is a list of all circuit signals whose values are relevant to the currently active Expect Events and Full Expect Events in all threads of the circuit verification subsystem.

Figure 3C:
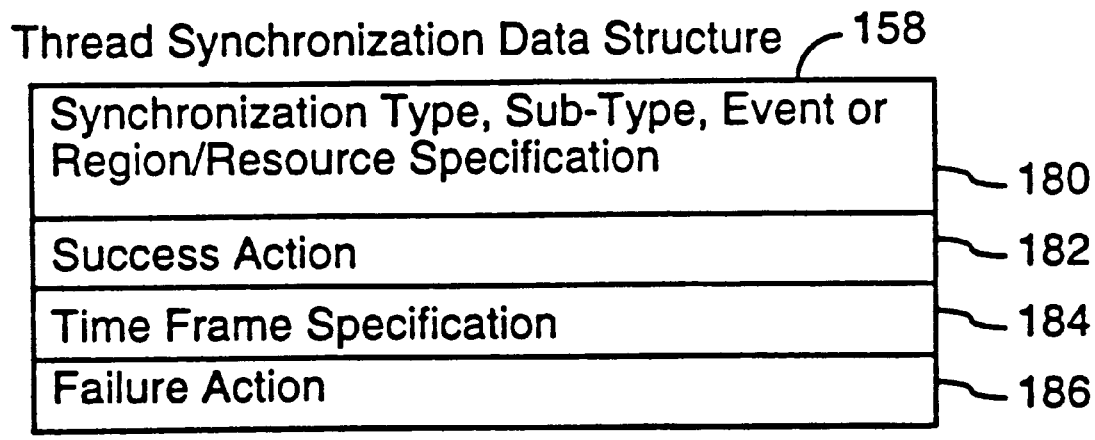

Referring to FIG. 3C, at least three types of thread synchronization are provided by the preferred embodiment: 1) event signal based synchronization, 2) joining, in which a parent thread's execution is resumed when zero or more of its children threads complete their execution, and 3) "region" based synchronization, which are similar to mutexes, for ensuring that only one thread of execution uses each specified resource associated with a simulated circuit.

Each thread synchronization data structure 158 includes information indicating the type of thread synchronization control represented by the data structure, a sub-type indicator representing any sequence or logic requirements, plus a combination of events or region resources for event based synchronization and region based synchronization. Each thread synchronization data structure 158 also includes a success action 182. In some cases a thread synchronization data structure 158 may include a time frame specification 184 and a failure action 186.

In the preferred embodiment, the various threads of the test bench can generate "event signals" that are distinct from signals in the simulated circuit. These event signals are the values of special "event" variables defined in the test bench. Event signals are generated by "trigger" commands in the portion of the test bench for a particular thread. Each trigger command specifies whether a particular event signal is to be "pulsed," turned "on," or turned "off." For example, the following trigger commands:

Trigger one-shot, EventA

Trigger On, EventB

Trigger Off, EventC pulse the EventA signal, turn the EventB signal on and turn the EventC signal off. These event signals are global to the entire test bench, and the status of any combination of event signals can be used to block or unblock any specified thread.

A typical thread synchronization data structure 158 is a "synchronization" command or combination that indicates, for instance, when events A, B and C have all occurred, execution of thread T1 shall be started or restarted at a specified point in its decision tree. Another typical thread control event combination 158 is a "join" command or combination that indicates, for instance, that when threads T1, T2 and T3 have completed, thread T0 shall be started or restarted at a specified point in its decision tree.

The thread synchronization data structure 158 can optionally include sequence requirements (by specifying a synchronization subtype of "ordered," indicating that the success action 182 is to be performed only if the specified events occur in a particular order. For instance, by providing a number of such thread control event combinations 158, each in a different thread and each specifying a different event sequence, the test bench can make its operation dependent on the order in which certain events occur in the simulated circuit.

Optionally, for some types of thread control event combinations a time frame 184 and an associated failure action 186 can be specified. In this case, if the specified event combination or sequence does not occur within the specified time frame, then the specified failure action is performed.

Test benches can also include "fork" commands for generating (i.e., forking) new threads of execution, and "join" commands for restarting the execution of the thread that performed the fork command. The fork command specifies for each new thread the sequence of commands to be executed in each of those new threads. Execution of a fork command automatically blocks further execution of the "parent" thread that executed the fork command, unless the fork command is followed by a "join any" command.

The join command, which generally immediately follows a fork command, includes one of three options: all, any or none. The join command is presented by a thread synchronization data structure 158 as having a synchronization type of "join" and a sub-type of "all," "any" or "none."

The "join all" command specifies that the parent thread's execution is unblocked (i.e., restarted at the command after the join command in the test bench) when all child threads of the parent have completed their execution. The "join any" command specifies that the parent thread's execution is restarted when any one of the child threads of the parent completes its execution. The "join none" command specifies that the parent thread's execution is not blocked by the preceding fork command, and thus the parent thread continues execution while the child threads are executing.

Region based thread synchronization works as follows. It is often the case that any particular region of the circuit being simulated, or any resource associated with the circuit such as a particular address value, should only be tested by one test bench thread of execution at a time. In test benches that use random or pseudorandom test methods, or where the timing of certain test sequences is variable, region based thread synchronization is used to prevent two or more test bench threads of execution from testing the same circuit region or resource at the same time.

The test bench can define one or more "regions," and can include "region enter" statements that request ownership of one or more "sub-regions" of a specified region, as well as "region exit" statements that relinquish ownership of one or more "sub-regions" of a specified region. "Regions" and "sub-regions" are typically associated with circuit regions and sub-regions or circuit resources. In the preferred embodiment, regions are identified by names, such as "Addr_Region" and "Region123", while subregions are identified by integers such as 1, 156 and the like. An example of region_enter command is:

region_enter Wait, RegionA, 12, 13, 15

Where "Wait" indicates that the thread executing the command will be blocked until all the requested resources are available, "RegionA" represents a defined region, and "12," "13," and "15" represent specific resources in that region that are being requested. Thus, the above command causes the executing thread to be blocked until resources 12, 13 and 15 of RegionA are available. When all of the specified resources become available, they are immediately registered by the verification engine as being in used by the requesting thread (i.e., they are marked as being unavailable for use by any other thread).

The command region_enter NoWait, RegionA, 12, 13, 15 is used to determine if any of the specified resources are in use. If al! of the specified are available, they are immediately registered as being in use by the requesting thread. If any of the specified resources are in use, the region_enter function returns with a return value (e.g., 0) that indicates that at least one of the requested resources was not available.

The command region_exit RegionA, 12, 13, 15 is used to release ownership of the specified resources. Resources registered as being in use by a thread continue to be unavailable to other threads until the thread using the resources releases them with a region_exit command or execution of that thread is completed.

The thread synchronization data structure 158 is used to represent region_enter commands by indicating a synchronization type of "region," a sub-type of "wait" or "no-wait," and a region specification indicating the region and resources being requested. The success action 182 indicates which thread to unblock when the specified resources become available. The thread synchronization data structure 158 used to represent region_enter commands is used by the verification engine 136 to determine when to block and unblock the associated thread's execution. The time frame specification 184 is used when a time-out is specified, in which case the associated thread is unblocked at the earlier of the specified resources becoming available or the specified time frame elapsing.

Additional features of the programming language and verification system used to define circuit verification test benches are described in the Vera Verification System Language Manual, which is available from System Science, Inc. of Palo Alto, Calif., and which is hereby incorporated by reference.

Figure 4A:
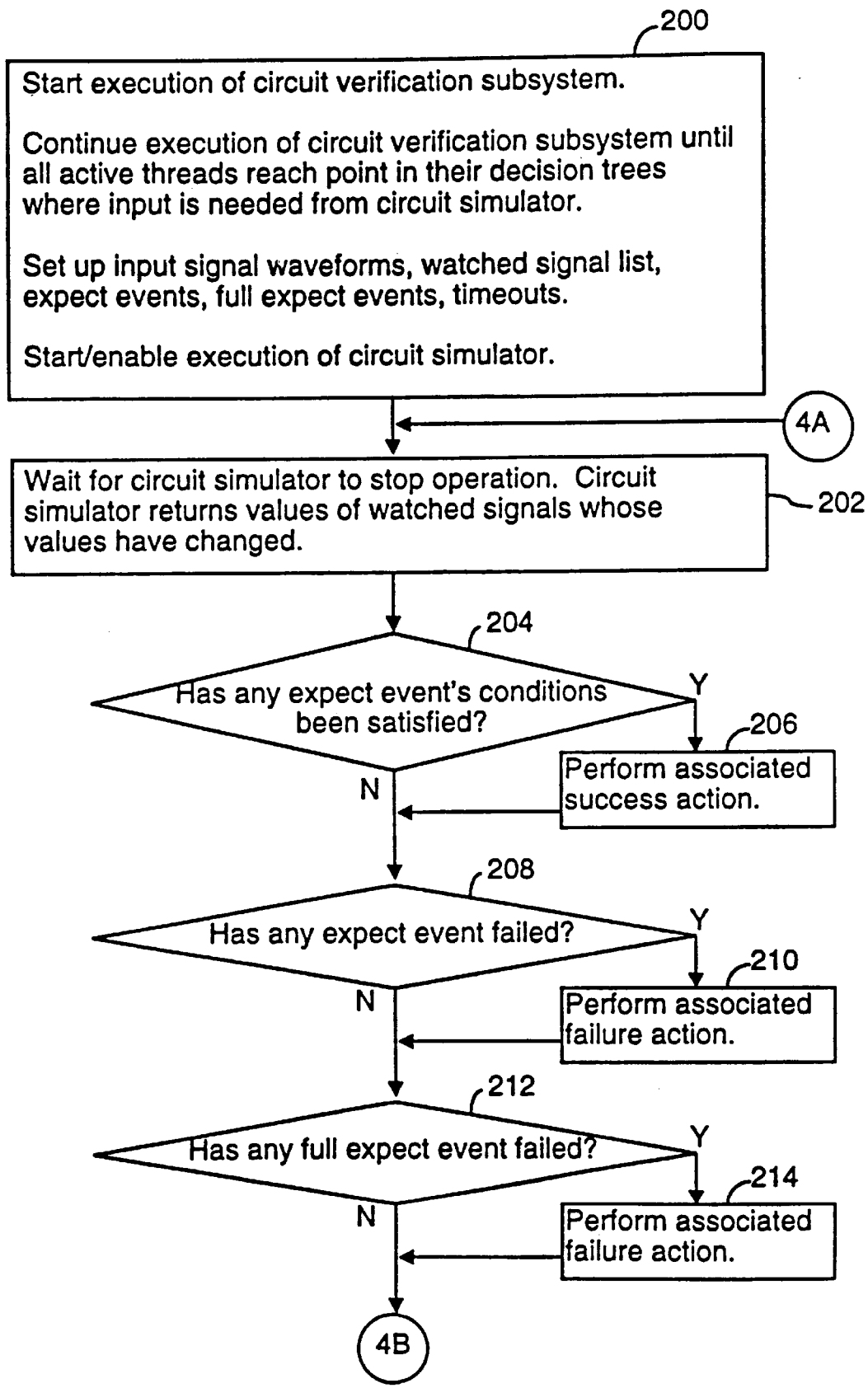
FIGS. 4A, and 4B are flow charts depicting the method of operation of a preferred embodiment of the present invention.
Figures 4, 4A, 4B:
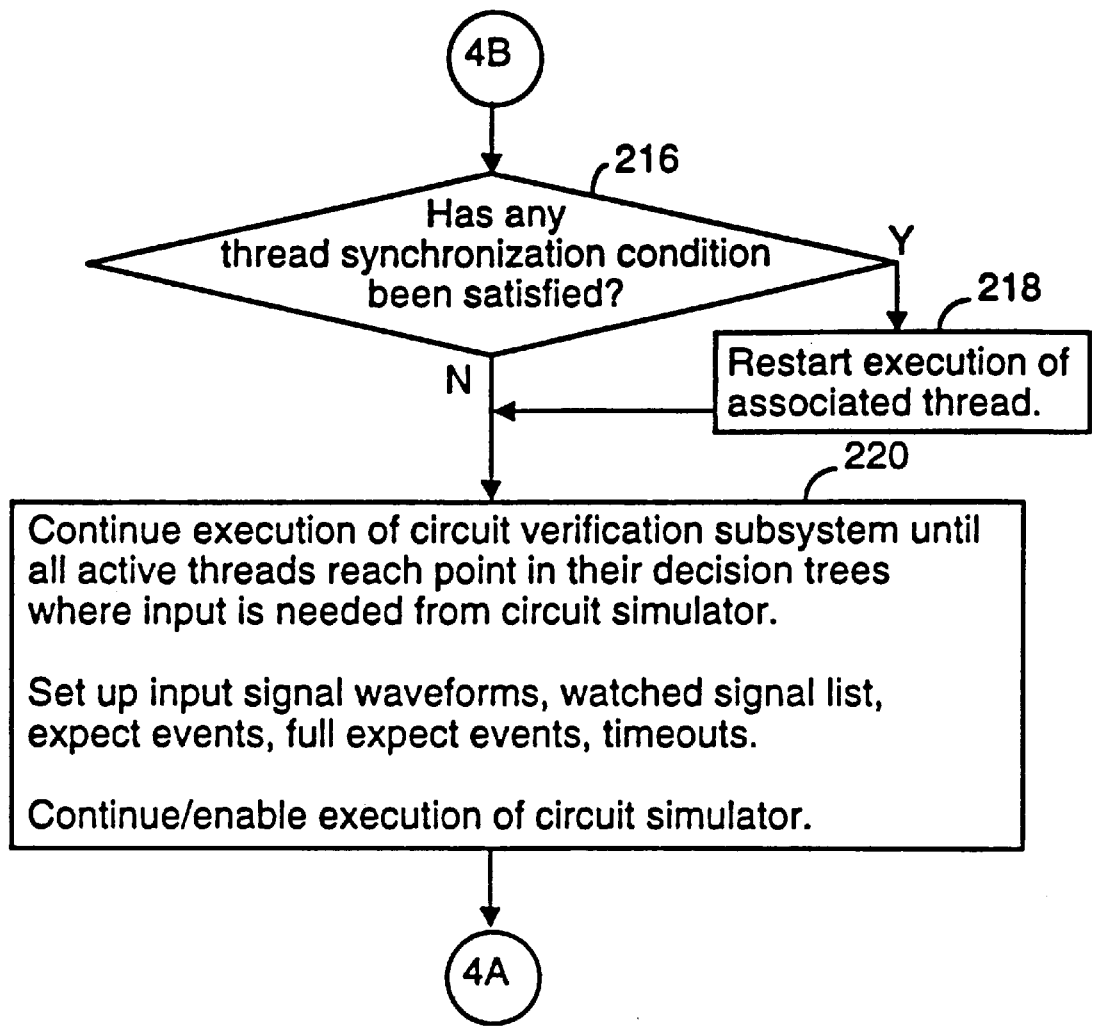

Referring to FIG. 4, the circuit verification subsystem and circuit simulator interact cooperatively as follows. "Control" passes back and forth between the circuit verification subsystem and circuit simulator during the simulation and verification process. At the beginning of a circuit simulation (step 200) the circuit verification subsystem 102 executes all active threads of execution until those threads of execution reach points in the decision threes where input is needed from the circuit simulator. During the execution of the active threads, input signal waveforms, watched signal lists, Expect Events, Full Expect Events, timeouts and other commands may be generated by multiple ones of those threads of execution. The verification engine 136 combines the input signal waveforms, watched signal lists, Expect Events, Full Expect Events, timeouts and other commands from its various threads of execution and sends a unified set of commands to the circuit simulator 102. Then the circuit verification subsystem enables continued execution of the circuit simulator.

Once its execution is enabled, the circuit simulator 102 simulates operation of the specified circuit until (A) any of the signals listed in the watched signal list changes value, or (B) a timeout expires. At that point, the circuit simulator stops operation (i.e., it freezes the simulation at the simulation time that a watched signal changed value or a timeout occurred) and sends information to the circuit verification subsystem indicating the reason the circuit simulator stopped the simulation. Conversely, while the circuit simulator 102 is in operation, the circuit verification subsystem 104 waits for the circuit simulator to stop execution and to send it information about the status of the simulation, as discussed above (202).

Once the circuit simulator has stopped and sent the corresponding information to the circuit verification subsystem 104, the circuit verification subsystem 104 performs a number of tests or checks. In particular, it checks to see if any Expect Event's conditions have been satisfied (204), and if so it performs the associated success action (206). It checks to see if any Except Event has failed (208) by timing out without the specified signal combination occurring, and if so it performs the associated failure action (208). It also checks to see if any Full Expect Event has failed (212), in which case it performs the associated failure action (214). Finally, it checks to see if any thread synchronization condition has been satisfied (216), in which case it restarts execution of the associated thread (218).

Unless a failure action (210, 214) causes the simulation and verification process to terminate, once these checks have been performed the circuit verification subsystem 102 executes all active threads of execution until those threads of execution reach points in their decision threes where input is needed from the circuit simulator. The circuit verification subsystem 104 combines the input signal waveforms, watched signal lists, Expect Events, Full Expect Events, timeouts and other commands generated by its various threads of execution and sends a unified set of commands to the circuit simulator 102. Then the circuit verification subsystem starts or enable execution of the circuit simulator (220).

The process of successively executing the circuit simulator to a next stop point and then executing the circuit verification subsystem continues until the simulation reaches a specified simulation endpoint or the circuit verification subsystem executes a command that terminates the circuit simulation and verification process.

ALTERNATE EMBODIMENTS

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

In particular, the present invention is equally applicable to a circuit verifier that works in conjunction with other types of circuit simulators than HDL circuit simulators. For instance, other embodiments of the present invention could be used with a logic simulator or with an analog circuit simulator.

When used with an analog circuit simulator, the signal combinations used in Expect Events and Full Expect Events would need to be represented as signals being above or below specified voltages or currents instead of being at specified logic values. Thus a signal combination in such an embodiment might be "Signal1>4.2v & Signal2 $\leq$0.8v".

Furthermore, the present invention could be used a "device design verifier" for use in conjunction with device simulators other than electronic circuit simulators. For instance, the present invention could be used in conjunction with a mechanical system simulator to verify that a specified mechanical design satisfies specified operational correctness and/or performance criteria.

The present invention could also be used in an integrated system that incorporates both device simulation and design verification capabilities in a single integrated system, using a single device specification and testing language. In such an embodiment the transfer of control between tasks related to simulating the specified hardware and those related to its verification would occur within the system. Furthermore, in some alternate embodiments verification tasks could be performed on a continuing basis during simulation as an integrated part of the simulation process.

What is claimed is:

1. A computer program product for use in conjunction with a computer system, the computer program product configured to direct the computer system to verify operation of a specified system, the computer program product comprising a computer readable storage medium and a computer program mechanism embedded therein, the computer program mechanism comprising:

verification procedures for interconnection with a set of simulation procedures so as to interleave performance of system verification operations with system simulation operations;

the verification procedures including instructions for executing a test bench so as to define operational correctness and/or performance criteria for the specified system, the operational correctness and/or performance criteria including an Expect Event, the Expect Event comprising a combination of one or more signal values that are expected to occur during simulation of the specified system, and a time frame during which the signal value combination is expected to occur; wherein the time frame for the Expect Event has a specified simulation start time and a specified nonzero, finite duration; and the verification procedures including instructions for blocking execution of a thread of execution associated with the test bench until the earlier of the combination of one or more signal values occurring during simulation of the specified system and the time frame expiring.

2. The computer program product of claim 1, the Expect Event having an associated failure action to be performed if the signal value combination fails to occur during the time frame; and the verification procedures including instructions for determining, upon receiving control from the simulation procedures, whether the Expect Event has failed and for then performing the associated failure action.

3. The computer program product of claim 2, the verification procedures specifying to the simulation procedures a list of watched signals whose values are specified in the Expect Event; and the simulation procedures including a simulation engine for simulating operation of the specified system in accordance with specified input signal waveforms until any signal included in the watched signal list specified by the verification procedures changes value, and for then passing control to the verification procedures.

4. The computer program product of claim 1, the verification procedures including instructions for performing a success action when the Expect Event has been satisfied; and a subset of the success actions including executing instructions that affect operation of the simulation procedures.

5. The computer program product of claim 1, the verification procedures including instructions for performing a respective success action when a respective one of the Expect Events has been satisfied, and instructions for performing a respective failure action when the signal value combination for the respective one of the Expect Events fails to occur during the time frame; and a subset of the success and failure actions including executing instructions that affect operation of the simulation procedures.

6. The computer program product of claim 5, a subset of the success and failure actions including executing instructions for sending input signal waveforms to the simulation procedures for use while simulating operation of the specified system.

7. The computer program product of claim 1, the operational correctness and/or performance criteria including a Full Expect Event, the Full Expect Event comprising a combination of one or more signal values that are expected to remain true for an associated time frame during simulation of the specified system; wherein the time frame for the Full Expect Event has a specified simulation start time and a specified nonzero, finite duration; and the verification procedures including instructions for performing a failure action if the signal value combination for the Full Expect Event fails to remain true during the Full Expect Event's associated time frame.

8. The computer program product of claim 1, the test bench including multiple concurrent threads, each thread having associated actions to be performed by the thread when execution of the thread is enabled; and the verification procedures including thread synchronization instructions for blocking execution of respective ones of the threads until, for each blocked thread, a respective defined combination of events occurs, the combination of events comprising a combination of event signals generated by various ones of the threads during execution of the threads.

9. The computer program product of claim 1, the test bench including multiple concurrent threads, each thread having associated actions to be performed by the thread when execution of the thread is enabled; and the verification procedures including thread synchronization instructions for blocking execution of respective ones of the threads until, for each blocked thread, a respective defined combination of events occurs, the combination of events comprising a combination of event signals generated in a specified order by various ones of the threads during execution of the threads.

10. The computer program product of claim 1, the test bench including multiple concurrent threads, each thread having associated actions to be performed by the thread when execution of the thread is enabled;

the verification procedures including thread synchronization instructions for blocking execution of respective ones of the threads until, for each blocked thread, a respective defined combination of events occurs;

the verification procedures including instructions for creating and executing child threads in response to execution of a predefined fork command by a parent thread comprising one of the multiple threads, and for blocking the parent thread's execution after execution of the fork command;

wherein the respective defined combination of events for unblocking the parent thread's execution comprises completing execution of all of the child threads.

11. The computer program product of claim 1, the test bench including multiple concurrent threads, each thread having associated actions to be performed by the thread when execution of the thread is enabled;

the verification procedures including thread synchronization instructions for blocking execution of respective ones of the threads until, for each blocked thread, a respective defined combination of events occurs;

the verification procedures including instructions for creating and executing child threads in response to execution of a predefined fork command by a parent thread comprising one of the multiple threads, and for blocking the parent thread's execution after execution of the fork command;

wherein the respective defined combination of events for unblocking the parent thread's execution comprises completing execution of any of the child threads.

12. The computer program product of claim 1, the test bench including multiple concurrent threads, each thread having associated actions to be performed by the thread when execution of the thread is enabled;

the verification procedures including thread synchronization instructions for blocking execution of respective ones of the threads until, for each blocked thread, a respective defined combination of events occurs; and the verification procedures including instructions for responding to execution of resource request commands by respective ones of the threads by blocking execution of each respective thread for which a predefined resource request command has been executed until all resources in a list of resources specified by the predefined resource request command are available, and for then marking as unavailable the resources in the list of resources.

13. A simulation and verification system, comprising:

a simulator and verifier coupled so as to pass control back and forth between each other;

the verifier executing a test bench so as to define operational correctness and/or performance criteria for a specified system, the operational correctness and/or performance criteria including at least one Expect Event, each Expect Event comprising a combination of one or more signal values that are expected to occur during simulation of the specified system, and a time frame during which the signal value combination is expected to occur; wherein the time frame for each Expect Event has a specified simulation start time and a specified nonzero, finite duration; and the verifier including instructions for blocking execution of a thread of execution associated with the test bench until the earlier of the combination of one or more signal values occurring during simulation of the specified system and the time frame expiring.

14. The simulation and verification system of claim 13, the Expect Event having an associated failure action to be performed if the signal value combination fails to occur during the time frame; and the verifier including instructions, upon receiving control from the verifier, for determining whether the Expect Event has failed and for then performing the associated failure action.

15. The simulation and verification system of claim 14, the verifier specifying to the simulator a list of watched signals that includes signals whose values are specified in the at least one Expect Event; and the simulator including a simulation engine for simulating operation of a specified system in accordance with specified input signal waveforms until any signal including in the watched signal list specified by sad verifier changes value, and for then passing control to the verifier.

16. The simulation and verification system of claim 13, the verifier including instructions for performing a respective success action when a respective one of the Expect Events has been satisfied; and a subset of the success actions including executing instructions that affect operation of the simulator.

17. The simulation and verification system of claim 13, the verifier including instructions for performing a respective success action when a respective one of the Expect Events has been satisfied, and instructions for performing a respective failure action when the signal value combination fails for the respective one of the Expect Events to occur during the time frame; and a subset of the success and failure actions including executing instructions that affect operation of the simulator.

18. The simulation and verification system of claim 17, at least a subset of the success and failure actions including executing instructions for sending input signal waveforms to the simulator for use while simulating operation of the specified system.

19. The simulation and verification system of claim 13, the operational correctness and/or performance criteria including at least one Full Expect Event, each Full Expect Event comprising a combination of one or more signal values that are expected to remain true for an associated time frame during simulation of the specified system; wherein the time frame for each Full Expect Event has a specified simulation start time and a specified nonzero, finite duration; and the verifier including instructions for performing a failure action if the signal value combination for a respective Full Expect Event fails to remain true during the respective Full Expect Event's associated time frame.

20. The simulation and verification system of claim 13, the test bench including multiple concurrent threads, each thread having associated actions to be performed by the thread when execution of the thread is enabled; and the verifier including thread synchronization instructions for blocking execution of respective ones of the threads until, for each blocked thread, a respective defined combination of events occurs, the combination of events comprising a combination of event signals generated by various ones of the threads during execution of the threads.

21. The simulation and verification system of claim 13, the test bench including multiple concurrent threads, each thread having associated actions to be performed by the thread when execution of the thread is enabled; and the verifier including thread synchronization instructions for blocking execution of respective ones of the threads until, for each blocked thread, a respective defined combination of events occurs, the combination of events comprising a combination of event signals generated in a specified order by various ones of the threads during execution of the threads.

22. The simulation and verification system of claim 13, the test bench including multiple concurrent threads, each thread having associated actions to be performed by the thread when execution of the thread is enabled;

the verifier including thread synchronization instructions for blocking execution of respective ones of the threads until, for each blocked thread, a respective defined combination of events occurs;

the verifier including instructions for creating and executing child threads in response to execution of a predefined fork command by a parent thread comprising one of the multiple threads, and for blocking the parent thread's execution after execution of the fork command;

wherein the respective defined combination of events for unblocking the parent thread's execution comprises completing execution of all of the child threads.

23. The simulation and verification system of claim 13, the test bench including multiple concurrent threads, each thread having associated actions to be performed by the thread when execution of the thread is enabled;

the verifier including thread synchronization instructions for blocking execution of respective ones of the threads until, for each blocked thread, a respective defined combination of events occurs;

the verifier including instructions for creating and executing child threads in response to execution of a predefined fork command by a parent thread comprising one of the multiple threads, and for blocking the parent thread's execution after execution of the fork command;

wherein the respective defined combination of events for unblocking the parent thread's execution comprises completing execution of any of the child threads.

24. The simulation and verification system of claim 13, the test bench including multiple concurrent threads, each thread having associated actions to be performed by the thread when execution of the thread is enabled;

the verifier including thread synchronization instructions for blocking execution of respective ones of the threads until, for each blocked thread, a respective defined combination of events occurs; and the verifier including instructions for responding to execution of resource request commands by respective ones of the threads by blocking execution of each respective thread for which a predefined resource request command has been executed until all resources in a list of resources specified by the predefined resource request command are available, and for then marking as unavailable the resources in the list of resources.

25. A computer program product for use in conjunction with a computer system, the computer program product configured to direct the computer system to verify operation of a specified system, the computer program product comprising a computer readable storage medium and a computer program mechanism embedded therein, the computer program mechanism comprising:

verification procedures for interconnection with a set of simulation procedures so as to interleave performance of verification operations with simulation operations;

the verification procedures including instructions for executing a test bench so as to define operational correctness and/or performance criteria for the specified system, the operational correctness and/or performance criteria including at least one Full Expect Event, each Full Expect Event comprising a combination of one or more signal values that are expected to remain true for an associated time frame during simulation of the specified system; wherein the time frame for each Full Expect Event has a specified simulation start time and a specified nonzero, finite duration; and the verification procedures including instructions for performing a failure action if the signal value combination for a respective Full Expect Event fails to remain true during the respective Full Expect Event's associated time frame.

26. A simulation and verification system, comprising:

a simulator and verifier coupled so as to pass control back and forth between each other;

the verifier executing a test bench so as to define operational correctness and/or performance criteria for a specified system, the operational correctness and/or performance criteria including at least one Full Expect Event, each Full Expect Event comprising a combination of one or more signal values that are expected to remain true for an associated time frame during simulation of the specified system; wherein the time frame for each Full Expect Event has a specified simulation start time and a specified nonzero, finite duration; and the verifier including instructions for performing a failure action if the signal value combination for a respective Full Expect Event fails to remain true during the respective Full Expect Event's associated time frame.

27. A computer program product for use in conjunction with a computer system, the computer program product configured to direct the computer system to verify operation of a specified system, the computer program product comprising a computer readable storage medium and a computer program mechanism embedded therein, the computer program mechanism comprising:

verification procedures for interconnection with a set of simulation procedures so as to interleave performance of verification operations with simulation operations;

the verification procedures including instructions for executing a test bench so as to define operational correctness and/or performance criteria for the specified system, the test bench including multiple concurrent threads, each thread having associated actions to be performed by the thread when execution of the thread is enabled; and the verification procedures further including thread synchronization instructions for blocking execution of respective ones of the threads until, for each blocked thread, a respective defined combination of events occurs.

28. The computer program product of claim 27, wherein the combination of events comprises a combination of event signals generated by various ones of the threads during execution of the threads.

29. The computer program product of claim 27, the verification procedures including instructions for creating and executing child threads in response to execution of a predefined fork command by a parent thread comprising one of the multiple threads, and for blocking the parent thread's execution after execution of the fork command;

wherein the respective defined combination of events for unblocking the parent thread's execution comprises completing execution of all of the child threads.

30. The computer program product of claim 27, the verification procedures including instructions for creating and executing child threads of execution in response to execution of a predefined fork command by a parent thread comprising one of the multiple threads, and for blocking the parent thread's execution after execution of the fork command;

wherein the respective defined combination of events for unblocking the parent thread's execution comprises completing execution of any of the child threads of execution.

31. The computer program product of claim 27, the verification procedures including instructions for responding to execution of resource request commands by respective ones of the threads by blocking execution of each respective thread for which a predefined resource request command has been executed until all resources in a list of resources specified by the predefined resource request command are available, and for then marking as unavailable the resources in the list of resources.

32. The computer program product of claim 31, wherein the resources in the list of resources continue to be marked as unavailable until the respective thread releases the resources in the list of resources or execution of the respective thread is completed.

33. A simulation and verification system, comprising:

a simulator and verifier coupled so as to pass control back and forth between each other;

the verifier executing a test bench so as to define operational correctness and/or performance criteria for the specified system, the test bench including multiple concurrent threads, each thread having associated actions to be performed by the thread when execution of the thread is enabled; and the verifier further including thread synchronization instructions for blocking execution of respective ones of the threads until, for each blocked thread, a respective defined combination of events occurs;

wherein the combination of events comprises a combination of event signals generated by various ones of the threads during execution of the threads; and the verification procedures include instructions for creating and executing child threads in response to execution of a predefined fork command by a parent thread comprising one of the multiple threads, and for blocking the parent thread's execution after execution of the fork command.

34. The simulation and verification system of claim 33, wherein the respective defined combination of events for unblocking the parent thread's execution comprises completing execution of all of the child threads.

35. The simulation and verification system of claim 33, wherein the respective defined combination of events for unblocking the parent thread's execution comprises completing execution of any of the child threads of execution.

36. The simulation and verification system of claim 33, the verifier including instructions for responding to execution of resource request commands by respective ones of the threads by blocking execution of each respective thread for which a predefined resource request command has been executed until all resources in a list of resources specified by the predefined resource request command are available, and for then marking as unavailable the resources in the list of resources.

37. The simulation and verification system of claim 36, wherein the resources in the list of resources continue to be marked as unavailable until the respective thread releases the resources in the list of resources or execution of the respective thread is completed.

* * * * *